US009465067B2

(12) United States Patent
Paolone et al.

(10) Patent No.: US 9,465,067 B2
(45) Date of Patent: Oct. 11, 2016

(54) EFFICIENT METHOD BASED ON THE ELECTROMAGNETIC TIME REVERSAL TO LOCATE FAULTS IN POWER NETWORK

(71) Applicants: Mario Paolone, Paudex (CH); Farhad Rachidi-Haeri, Pully (CH); Hossein Mahmoudimanesh, Bron (FR); Reza Razzaghi, Lausanne (CH); Gaspard Lugrin, Montreux (CH)

(72) Inventors: Mario Paolone, Paudex (CH); Farhad Rachidi-Haeri, Pully (CH); Hossein Mahmoudimanesh, Bron (FR); Reza Razzaghi, Lausanne (CH); Gaspard Lugrin, Montreux (CH)

(73) Assignee: ECOLE POLYTECHNIQUE FÉDÉRALE DE LAUSANNE, Lausanne (CH)

( * ) Notice: Subject to any disclaimer, the term of this patent is extended or adjusted under 35 U.S.C. 154(b) by 810 days.

(21) Appl. No.: 13/858,227

(22) Filed: Apr. 8, 2013

(65) Prior Publication Data
US 2014/0300370 A1 Oct. 9, 2014

(51) Int. Cl.
*G01R 31/08* (2006.01)

(52) U.S. Cl.
CPC ........... *G01R 31/086* (2013.01); *G01R 31/085* (2013.01)

(58) Field of Classification Search
CPC ..................... G01R 31/085; G01R 31/086
See application file for complete search history.

(56) References Cited

U.S. PATENT DOCUMENTS 6,798,211 B1 * 9/2004 Rockwell ............. G01R 31/085
324/527

OTHER PUBLICATIONS

IEEE Std C37.114, "IEEE guide for determining fault location on AC transmission and distribution lines", 2004.
H. M. Manesh, G. Lugrin, R. Razzaghi, C. Romero, M. Paolone, F. Rachidi, "A New Method to Locate Faults in Power Networks Based on Electromagnetic Time Reversal", Proc. of 13th IEEE International Workshop on Signal Processing Advances in Wireless Communications, SPAWC, Jun. 2012.
(Continued)

*Primary Examiner* — John Breene
*Assistant Examiner* — Jeffrey C Morgan
(74) *Attorney, Agent, or Firm* — The Law Office of Joseph L. Felber

(57) ABSTRACT

A time reversal process for determining a fault location in an electrical power network comprising multi-conductor lines, comprises measuring at an observation point located anywhere along one of the multi-conductor lines, for each of the conductors of the multi-conductor line, respectively a fault-originated electromagnetic transient signal; defining a set of guessed fault locations each having a different determined location in the electrical power network, and each of the guessed fault locations is attributed a same arbitrary fault impedance; defining a network model for the electrical power network, based on its topology and multi-conductor lines electrical parameters capable of reproducing in the network model the electromagnetic traveling waves; and computing for each conductor a time inversion of the measured fault-originated electromagnetic transients signal. The time reversal process method further comprises, as detailed herein, back-injecting a computed time inversion; calculating fault current signal energy; and identifying the fault location.

4 Claims, 12 Drawing Sheets

(56) References Cited

OTHER PUBLICATIONS

M. S. Sachdev and R. Agarwal, "A technique for estimating transmission line fault locations from digital impedance relay measurements" IEEE Trans. Power Del., vol. 3, No. 1, pp. 121-129, Jan. 1988.

K. Srinivasan and A. St.-Jacques, "A new fault location algorithm for radial transmission lines with loads," IEEE Trans. Power Del., vol. 4, No. 3, pp. 1676-1682, Jul. 1989.

A. A. Girgis, D. G. Hart, and W. L. Peterson, "A new fault location technique for two- and three-terminal lines," IEEE Trans. Power Del., vol. 7, No. 1, pp. 98-107, Jan. 1992.

G. B. Ancell and N. C. Pahalawatha, "Maximum likelihood estimation of fault location on transmission lines using travelling waves," IEEE Trans. Power Del., vol. 9, No. 2, pp. 680-689, Apr. 1994.

O. Chaari, M. Meunier, and F. Brouaye, "Wavelets: A new tool for resonant grounded power distribution systems relaying," IEEE Trans. Power Del., vol. 11, No. 3, pp. 1301-1308, Jul. 1996.

F. H. Magnago and A. Abur, "Fault location using wavelets," IEEE Trans. Power Del., vol. 13, No. 4, pp. 1475-1480, Oct. 1998.

F. H. Magnago and A. Abur, "A new fault location technique for radial distribution systems based on high frequency signals," in Proc. IEEE-Power Eng. Soc. Summer Meeting, vol. 1, pp. 426-431, Jul. 18-22, 1999.

D. W. P. Thomas, R. E. Batty, C. Christopoulos, and A. Wang, "A novel transmission-line voltage measuring method," IEEE Trans. Instrum. Meas., vol. 47, No. 5, pp. 1265-1270, Oct. 1998.

F. Yan, Zh. Chen, Zh. Liang, Y. Kong, P. Li, "Fault location using wavelet packets", Proc. of Int. Conf. on Power System Technology, PowerCon 2002, vol. 4, pp. 2575-2579, Oct. 13-17, 2002.

A. Borghetti, S. Corsi, C. A. Nucci, M. Paolone, L. Peretto, and R. Tinarelli, "On the use of continuous-wavelet transform for fault location in distribution power networks," Elect. Power Energy Syst., vol. 28, pp. 608-617, 2006.

A. Borghetti, M. Bosetti, M. Di Silvestro, C.A. Nucci and M. Paolone, "Continuous-Wavelet Transform for Fault Location in Distribution Power Networks: Definition of Mother Wavelets Inferred from Fault Originated Transients", IEEE Trans. Power Del., vol. 23, No. 2, pp. 380-388, May 2008.

A. Borghetti, M. Bosetti, C.A. Nucci, M. Paolone, A. Abur, Integrated Use of Time-Frequency Wavelet Decompositions for Fault Location in Distribution Networks: Theory and Experimental Validation IEEE Trans. Power Del., vol. 25, issue 4, Oct. 2010, pp. 3139-3146.

M. Fink, C. Prada, F. Wu and D. Cassereau, "Self focusing in inhomogeneous media with time reversal acoustic mirrors", IEEE Ultrason. Symp., pp. 681-686, 1989.

M. Fink, "Time reversal of ultrasonic fields—Part I: Basic principles", IEEE Trans. on Ultrasonics, Ferroelectrics and Frequency Control, vol. 39, issue 5, Sep. 1992, pp. 555-566.

F. Wu, J.-L. Thomas, M. Fink, "Time reversal of ultrasonic fields Part II: Experimental results", IEEE Trans. on Ultrasonics, Ferroelectrics and Frequency Control, vol. 39, issue 5, Sep. 1992, pp. 567-578.

D. Cassereau, M. Fink, "Time-reversal of ultrasonic fields Part III: Theory of the closed time-reversal cavity", IEEE Trans. on Ultrasonics, Ferroelectrics and Frequency Control, vol. 39, issue 5, Sep. 1992, pp. 579-592.

G. Lerosey, J. de Rosny, A. Tourin, A. Derode, G. Montaldo, M. Fink, Time Reversal of Electromagnetic Waves, Phys. Rev. Lett. 92, pp. 193904-193901-193903, 2004.

D. Liu; G. Kang; L. Li; Y. Chen; S. Vasudevan, W. Joines, Q. Huo Liu, J. Krolik, L. Carin, "Electromagnetic time-reversal imaging of a target in a cluttered environment", IEEE Trans. Antennas Propagat., vol. 53, pp. 3058-3066, 2005.

H. Zhai, S. Sha, V. K. Shenoy, S. Jung, M. Lu, K. Min, S. Lee, D.S. Ha, "An Electronic Circuit System for Time-Reversal of Ultra-Wideband Short Impulses Based on Frequency-Domain Approach", IEEE Trans. Microwave Theory and Techniques,, vol. 58, issue: 1, pp. 74-86, 2010.

N. Mora, F. Rachidi, M. Rubinstein, "Application of the Time Reversal of Electromagnetic Fields to Locate Lightning Discharges", Journal of Atmospheric Research, vol. 117, pp. 78-85, 2012.

L. Abboud, A. Cozza and L. Pichon, "A Matched-Pulse Approach for Soft-Fault Detection in Complex Wire Networks", IEEE Trans. on Instrumentation and Measurements, vol. 61, issue: 6, pp. 1719-1732, Jun. 2012.

J.-G. Minonzio, "Décomposition de l'Opérateur de Retournement Temporel appliquée à l'imagerie et à la caractérisation ultrasonore", PhD dissertation, Université de Paris Jul. 2006.

G. Lugrin, N. Mora, F. Rachidi, M. Rubinstein, G. Diendorfer, "On the use of the time reversal of electromagnetic fields to locate lightning discharges", 31st International Conference on Lightning Protection (ICLP), Vienna, Austria, Sep. 3-7, 2012.

A. Borghetti, M. Bosetti, C.A. Nucci, M. Paolone, A. Abur, "Fault location in active distribution networks by means of the continuous-wavelet analysis of fault-originated high frequency transients", Proc. of the Cigré General Session 2010, Aug. 22-27, 2010, Paris, France, paper C4-108.

F. Rachidi, C.A. Nucci, M. Ianoz, C. Mazzetti, "Influence of a lossy ground on lightning-induced voltages on overhead lines", IEEE Trans. on Electromagnetic Compatibility, vol. 38, No. 3, Aug. 1996.

F. Rachidi, "A Review of Field-to-Transmission Line Coupling Models with Special Emphasis to Lightning-Induced Voltages", IEEE Trans. on Electromagnetic Compatibility, vol. 54, No. 4, pp. 898-911, 2012.

H. W. Dommel: "Digital computer solution of electromagnetic transients in single and multiphase networks", IEEE Transactions on Power Apparatus and Systems, vol. PAS-88, No. 4, pp. 388-399, Apr. 1969.

J. Mahseredjian, S. Lefebvre and X.-D. Do, "A new method for time-domain modelling of nonlinear circuits in large linear networks", Proc. of 11th Power Systems Computation Conference PSCC, Aug. 1993.

J. Mahseredjian, S. Dennetière, L. Dubè, B. Khodabakhchian and L. Gérin-Lajoie: "On a new approach for the simulation of transients in power systems". Electric Power Systems Research, vol. 77, Issue 11, Sep. 2007, pp. 1514-1520.

IEEE Distribution Planning Working Group, "Radial distribution test feeders," IEEE Trans. Power Syst., vol. 6, No. 3, pp. 975-985, Aug. 1991.

Manesh et al., "A New Method to Locate Faults in Power Networks Based on Electromagnetic Time Reversal," IEEE 13th International Workshop on Signal Processing Advances in Wireless Communications (SPAWC), 2012, pp. 469-474.

Razzaghi,"An Efficient Method Based on the Electromagnetic Time Reversal to Locate Faults in Power Networks," IEEE Transactions on Power Delivery, Manuscript ID: TPWRD-00932-2012.R1, Date Submitted by Authors: Jan. 24, 2013 (not yet published).

* cited by examiner (a)

(b)

(a)

(b)

(a)

(b)

EFFICIENT METHOD BASED ON THE ELECTROMAGNETIC TIME REVERSAL TO LOCATE FAULTS IN POWER NETWORK

TECHNICAL FIELD

The present invention is in the field of power systems operation and more precisely relates to a fault location functionality of power systems.

INTRODUCTION

The fault location functionality is an important on-line process required by power systems operation. It has a large influence on the security and quality of supply.

In transmission networks, this functionality is needed for the identification of the faulted line and the adequate reconfiguration of the network to anticipate severe cascading consequences. In distribution networks, fault location is more associated to the quality of service in terms of duration of interruptions when permanent faults occur. Still with reference to distribution networks, the increasing use of distributed generation calls for accurate and fast fault location procedures aimed at minimizing the network service restoration time, and, consequently, minimizing the unsupplied power.

As summarized in [1], [2], various procedures for fault location assessment have been proposed for both transmission and distribution power networks and, in this respect, two main categories can be identified: (i) methods that analyze pre- and post-fault voltage/current phasors (e.g. [3]-[5]) and, (ii) methods that analyze fault-originated electromagnetic transients of currents and/or voltages, (i.e. traveling waves generated by the fault itself, e.g. [6]-[14]).

As discussed in [2], with reference to the case of distribution networks, typical methods used nowadays are based on the estimation of the post-fault impedance observed in measurement points usually located in primary substations. With the hypothesis of having a fully passive power system, such estimation could provide useful information to locate the fault if compared with the line impedance. However, the presence of other sources (e.g. associated with the increasing penetration of dispersed generation) can largely affect the accuracy of these procedures. For these reasons, procedures that belong to the second of the above-mentioned categories may be less influenced by the presence of dispersed generation. This is because post-fault electromagnetic transients taking place within the first few milliseconds after the fault, are associated with the traveling waves originated by the fault itself and, therefore, are not influenced by the industrial-frequency power injections of distributed sources. The major drawbacks of this second category of methods are: (i) they require an assessment between the number of observation points vs the number of possible multiple fault location solutions; (ii) they require large bandwidth measuring systems.

Within this context, and by referring to the second of the above-mentioned categories, one aim of the present invention is to apply the theory of Time Reversal to the problem of the fault location. This method was developed firstly in the field of acoustics [15]-[18] and was more recently applied to electromagnetics (e.g. [19]-[22]). In what follows, we will make reference to the Time-Reversal process applied to electromagnetic transients using the acronym EMTR (Electromagnetic Time-Reversal).

The basic idea of the EMTR is to take advantage of the reversibility in time of the wave equation. The transients observed in specific observation points of the system are time-reversed and transmitted back into the system. The time-reversed signals are shown to converge to the source (fault) location. The EMTR presents several advantages, namely: (i) applicability in inhomogeneous media [15], (ii) efficiency for systems bounded in space [18] and characterized by a complex topology (in our case, networks characterized by multiple terminations).

In the literature related to fault location in wired networks, a method based on the use of the so-called "matched-pulse reflectometry", essentially based on the reflectometry approach and embedding some of the properties of the EMTR, has recently been presented in [23]. Another method based on the time reversal, called DORT (Decomposition of the Time Reversal Operator) [24], was also proposed to locate objects inside bi-dimensional or three-dimensional domains where wave equation holds (i.e. acoustic and electromagnetics).

In a previous study [2], the inventors of the present invention have presented a preliminary discussion on the applicability of the EMTR technique to locate faults in a single-conductor transmission line using multiple observation points. The present invention further aims at extending the applicability of such a fault location technique to the case of (i) a single observation point, (ii) multiconductor, inhomogeneous transmission lines (for example, composed of a number of overhead lines and coaxial cables). In addition, we present in this proposed patent (i) an experimental validation of the proposed fault location method by making use of a reduced-scale coaxial cable setup with hardware-emulated faults, (ii) an illustration of the proposed method's applicability to complex distribution networks (i.e. the one represented by the IEEE test distribution feeders), and (iii) an analysis of the robustness of the method against the fault impedance and type.

SUMMARY OF INVENTION

The invention provides a time reversal process method for determining a fault location in an electrical power network comprising multi-conductor lines, comprises measuring at an observation point located anywhere along one of the multi-conductor lines, for each of the conductors of the multi-conductor line, respectively a fault-originated electromagnetic transient signal; defining a set of guessed fault locations, each of the guessed fault locations having a different determined location in the electrical power network, and each of the guessed fault locations is attributed a same arbitrary fault impedance; defining a network model for the electrical power network, based on its topology and multi-conductor lines electrical parameters capable of reproducing in the network model the electromagnetic traveling waves; and computing for each conductor a time inversion of the measured fault-originated electromagnetic transients signal. The time reversal process method further comprises back-injecting in each conductor of the defined network model, corresponding to the multi-conductor line, the corresponding computed time inversion from a virtual observation point in the network model corresponding to the observation point; calculating in the network model the energy of a fault current signal for each of the guessed fault locations; and identifying the fault location as the guessed fault location providing the largest fault current signal energy.

In a preferred embodiment the measurement of the fault-originated electromagnetic transient signal is a current and/or a voltage measurement.

DRAWINGS

The invention will be better understood in light of the description of preferred embodiments and in reference to the drawings, wherein FIG. 1 contains a simplified representation of the post-fault line configuration;

FIG. 2 shows a representation of the EMTR applied to the single-line model of FIG. 1;

FIG. 3 contains a curve representing normalized energy of the fault current signal as a function of the guessed fault location $x'_f$ with single (solid line) and multiple (dashed line) observation points. The real fault location is at $x_f=8$ km;

FIG. 4 contains a representation of the EMTR applied to the single-line model of FIG. 1 where a single observation point is placed at the beginning of the line (x=0);

FIG. 5 shows a flow-chart of an example embodiment of the proposed fault location method;

FIG. 6 contains topologies adopted for the reduced-scale experimental setup: (a) single transmission line configuration (RG-58 coaxial cable), (b) a T-shape network made of both RG-58 and RG-59 coaxial cables;

FIG. 7 contains a schematic representation of the MOSFET-emulated fault adopted in the reduced-scale experimental setup;

Figure 11:
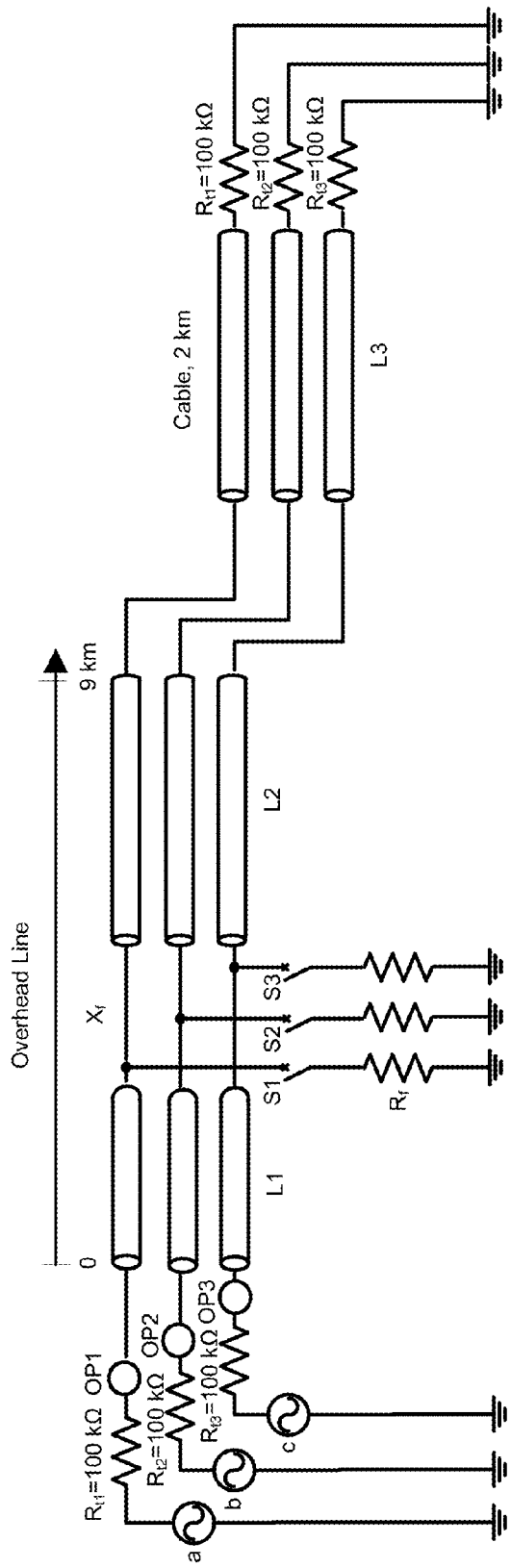
Figure 12:
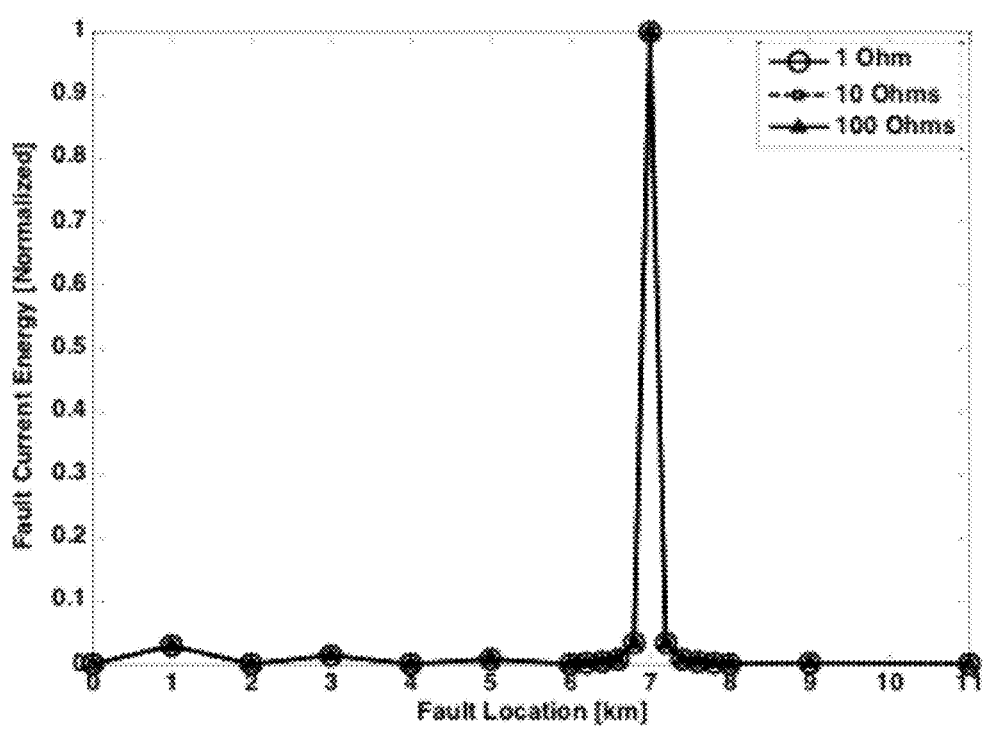
Figure 13:
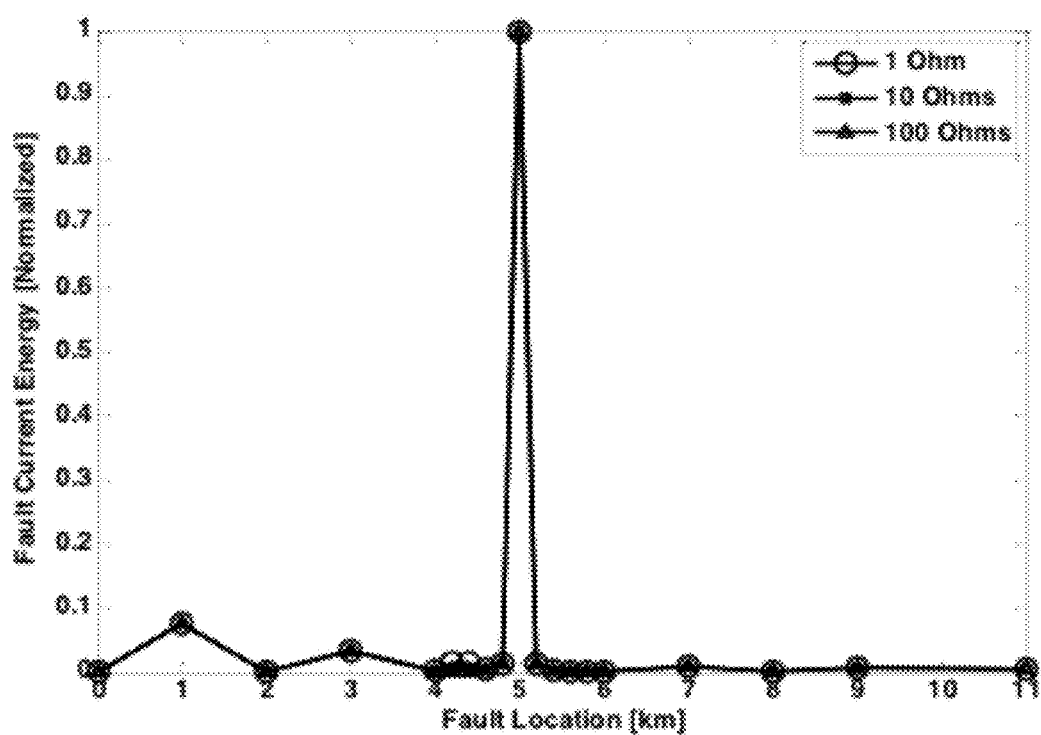
Figure 14:
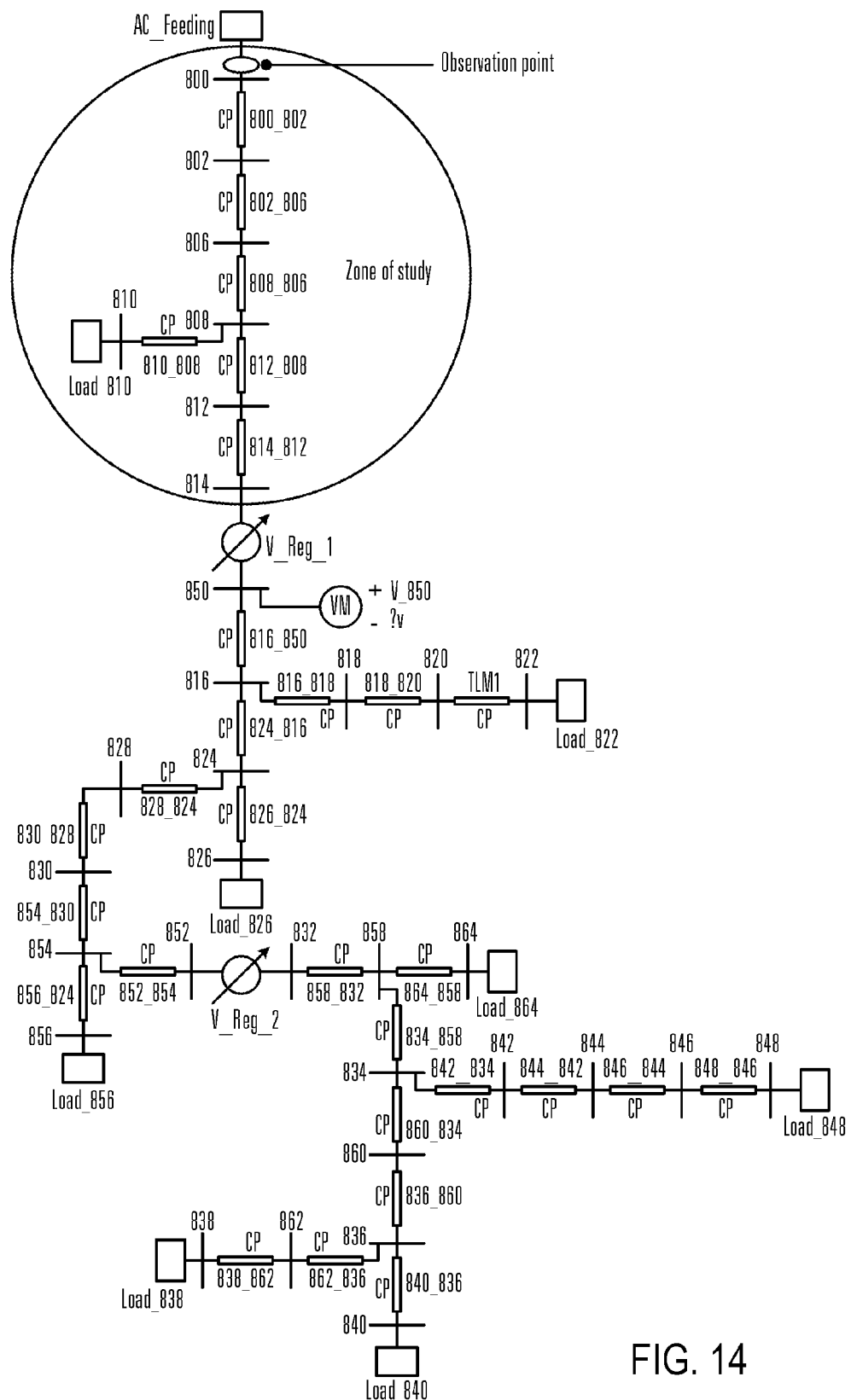
Figure 15:
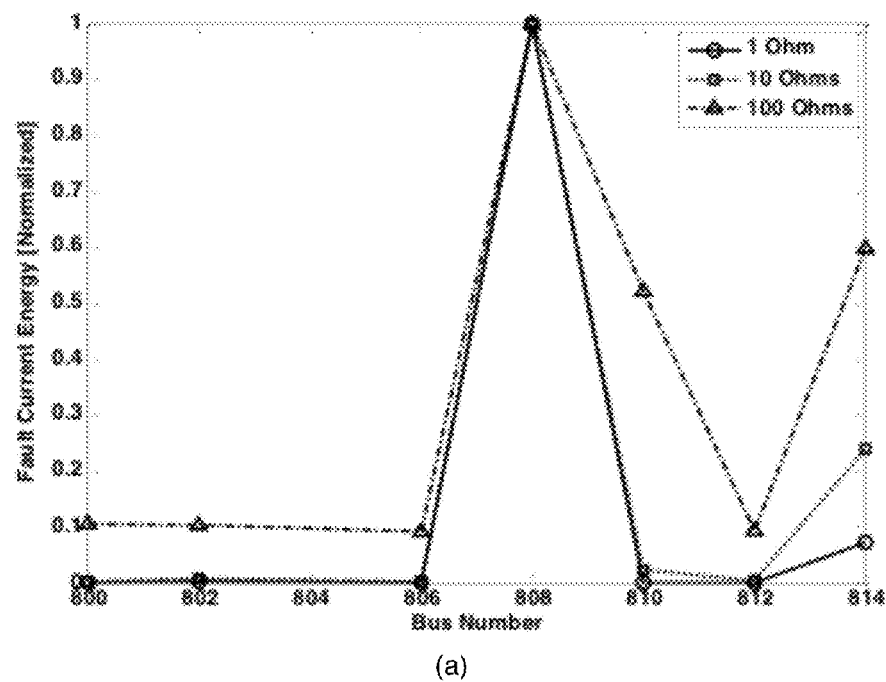
Figure 15:
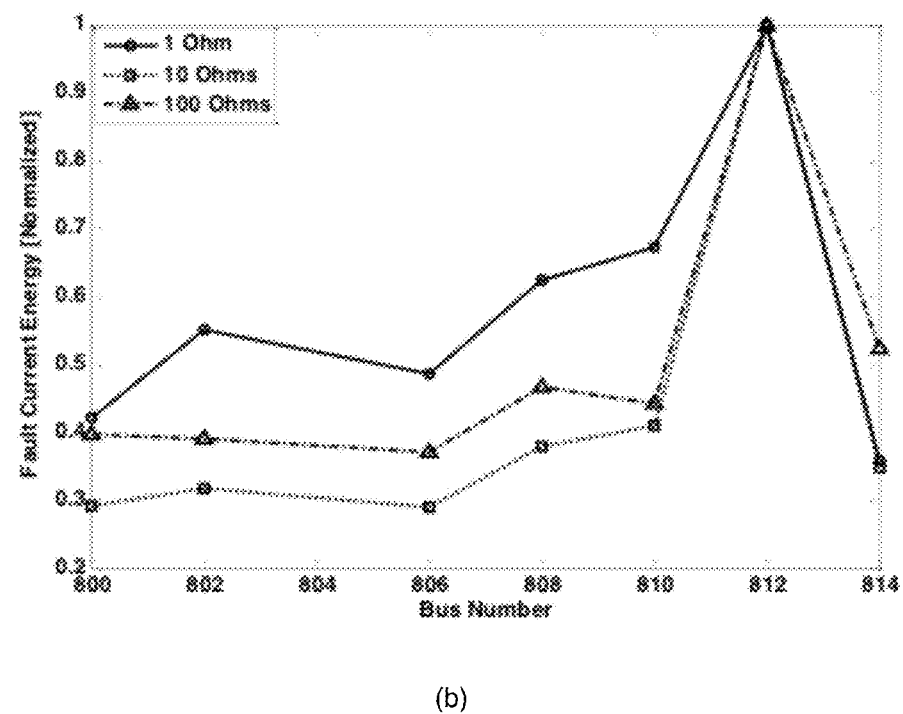
Figure 16:
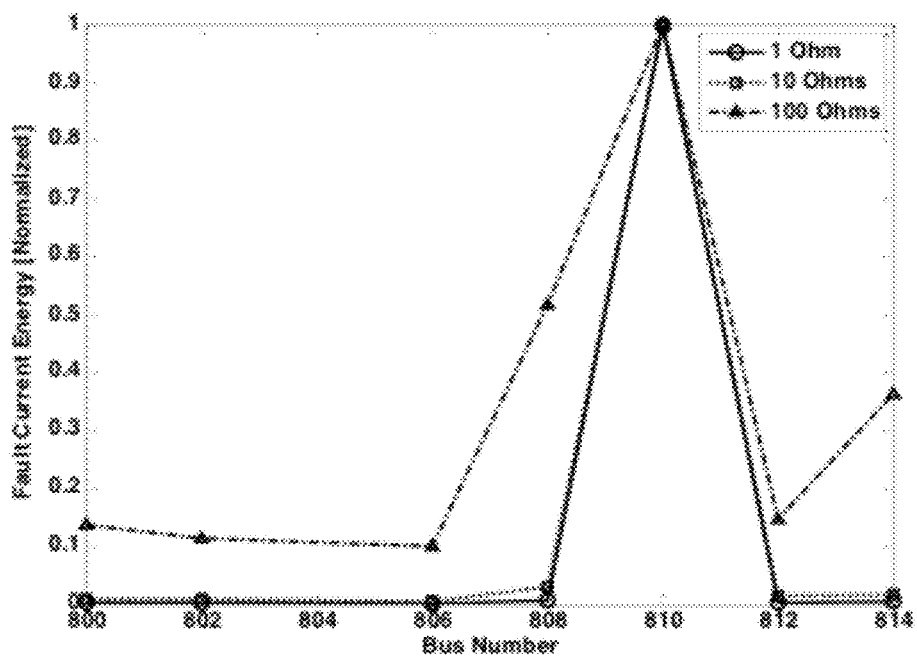
Figure 16:
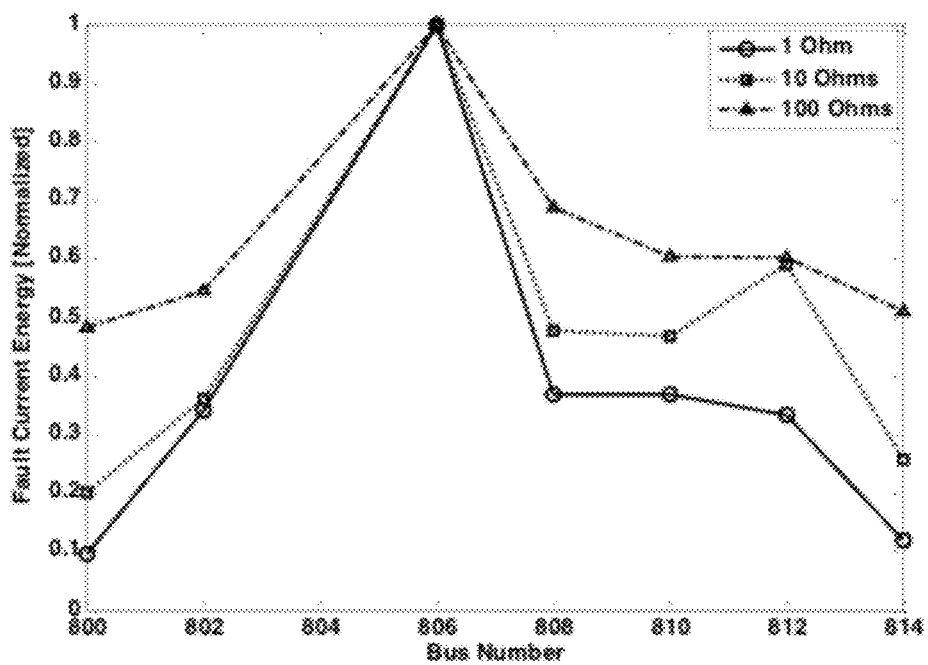

FIG. 11 contains a schematic representation of the system under study implemented in the EMTP-RV simulation environment;

FIG. 12 shows normalized energy of the fault current as a function of the guessed fault location and for different guessed fault resistance values. The real fault location is at $x_f=7$ km and fault impedance is 0Ω;

FIG. 13 shows normalized energy of the fault current as a function of the guessed fault location and for different guessed fault resistance values. The real fault location is at $x_f=5$ km and fault impedance is 100Ω;

FIG. 14 shows an IEEE 34-bus distribution system implemented in EMTP-RV;

FIG. 15 shows normalized energy of the fault current as a function of the guessed fault location and for different guessed fault resistance values: a) three-conductor-to-ground solid fault (0Ω) at Bus 808, b) three-conductor-to-ground high-impedance fault (100Ω) at Bus 812;

FIG. 16 shows normalized energy of the fault current as a function of the guessed fault location and for different guessed fault resistance values: a) single-conductor-to-ground solid fault (0Ω) at Bus 810, b) single-conductor-to-ground high-impedance fault (0Ω) at Bus 806.

DETAILED DESCRIPTION OF PREFERRED EMBODIMENTS

The invention will now be described in more detail on the basis of preferred embodiments and in reference to the drawings, whereby the description is structured with the following sections:

The basic aspects of the EMTR theory;

The main characteristics of electromagnetic transients originated by faults in power systems;

The applicability of the EMTR technique to locate fault. Using transmission line equations in the frequency domain, analytical expressions are derived permitting to infer the location of the fault. The time-domain implementation of the EMTR-based fault location technique is also illustrated;

Experimental validation of the proposed methodology using a reduced-scale model;

Illustration of the application of the proposed method to two cases: (i) an inhomogeneous network composed of mixed overhead-coaxial cable lines and (ii) a distribution network composed of the IEEE 34 bus test feeder. In both cases, different fault-types and fault-impedances have been considered. Additionally, fault-transients have been assumed to be recorded in a single observation point; and Final remarks on the performance of the proposed method.

Basic Concept of the EMTR Technique

In this Section, we examine the properties of the transmission line wave equations under time reversal [2]. The time-reversal operator corresponds to the change of the sign of the time, i.e. to the following transformation $$t \mapsto -t. \qquad (1)$$

An equation is defined as 'time-reversal invariant' if it is invariant under the application of the time-reversal operator. The voltage wave equation for a multiconductor, lossless transmission line reads $$\frac{\partial^2}{\partial x^2} U(x, t) - L'C' \frac{\partial^2}{\partial t^2} U(x, t) = 0 \qquad (2)$$

where U(x,t) is a vector containing the phase voltages at position x and time t, L' and C' are the per-unit-length parameter matrices of inductance and capacitance of the line, respectively. Time reversing (2) yields:

$$\frac{\partial^2}{\partial x^2} U(x, -t) - L'C' \frac{\partial^2}{\partial t^2} U(x, -t) = 0. \qquad (3)$$

Therefore, if U(x,t) is a solution of the wave equation, then U(x,-t) is a solution too. In other words, as described in [16]-[18] for ultrasonic waves, the wave equation is invariant under a time-reversal transformation if there is no absorption during propagation in the medium. In our specific application, this hypothesis is satisfied if the transmission line is lossless. However, since power network transmission lines are generally characterized by small values for the longitudinal resistance, the applicability of EMTR to this case could also be considered. This point will be further discussed in the sections herein under discussing experimental validation and illustrating the application of the proposed method to two cases (application examples).

In practical implementations, a signal s(x,t) is necessarily measured only during a finite period of time from an initial time selected here as the origin t=0 to a final time t=T, where T is the duration of the signal. To make the argument of the time-reversed variables be positive for the duration of the signal, we will add, in addition to time reversal, a time delay T [25]:

$$s(x,t) \mapsto s(x,T-t). \tag{4}$$

It is worth noting that, although the EMTR is defined in the time domain, it can also be applied in the frequency domain using the following equivalence:

$$f(\vec{r},-t) \leftrightarrow F^*(\vec{r},\omega) \tag{5}$$

where $F(\vec{r},\omega)$ is the Fourier transform of $f(\vec{r},t)$ and * denotes the complex conjugate.

Electromagnetic Transients Associated with Faults in Power Systems

A fault event in a power system can be associated with an injection into the power system itself of a step-like wave triggered by the fault occurrence. The fault-generated wave travels along the lines of the network and gets reflected at the line extremities which are characterized by reflection coefficients whose values depend on the line surge impedance (characteristic impedance) and the input impedances of the connected power components. In particular, the line extremities can be grouped into three categories, namely: line terminals with power transformers, junctions to other lines, and the fault location. As discussed in [14], [26], for each of these boundary conditions the following assumptions can be reasonably made:

extremities where a power transformer is connected can be assumed, for the traveling waves, as open circuits, and therefore the relevant voltage reflection coefficient is close to +1; indeed, fault-originated travelling waves are characterized by a spectrum with high-frequency components for which the input impedance of power transformers is generally dominated by a capacitive behavior with capacitances values in the order of few hundreds of pF (e.g. [26]);

extremities that correspond to a junction between more than two lines are characterized by a negative reflection coefficient;

fault location: the reflection coefficient of the extremity where the fault is occurring is close to −1, as the fault impedance value can be assumed to be significantly lower than the line surge impedance.

With the above assumptions, and for a given network topology, it is possible to determine a certain number of paths, each one delimited between two extremities. An observation point at which voltage or current waveforms are measured will observe a superposition of waves that are traveling along the various paths [27].

Therefore, we can conclude that the domain of application of any fault location method belonging to the second category described in the introduction section is formed by a mono-dimensional space (associated to the line longitudinal coordinate x) with given boundary conditions.

Application of the EMTR Method to Fault Location

The application of the EMTR to locate faults in a power network will be based on the following steps: (i) measurement of the fault-originated electromagnetic transient in a single observation point, (ii) simulation of the back-injection of the time-reversed measured fault signal for different guessed fault locations and using the network model, (iii) assessment of the fault location by determining, in the network model, the point characterized by the largest energy concentration associated with the back-injected time-reversed fault transients. These aspects will be better clarified in the next sections.

In what follows, we illustrate the analytical aspects related to the proposed EMTR-based fault location method. As described in [15]-[21], one of the main hypotheses of the EMTR method is that the topology of the system needs to remain unchanged during the transient phenomenon of interest. Fault transients in power networks do not satisfy such a condition as the presence of the fault itself involves a change in the network topology when the fault occurs (i.e. at $t=t_f$). However, for reversed times t such that $t<T-t_f$, EMTR is still applicable if the guessed fault is considered at the correct location. On the other hand, for a guessed location that does not coincide with the real one, time reversal invariance does not hold. As a result of this property, time-reversed back-propagated signals will combine constructively to reach a maximum at the correct fault location. This property will be validated in the next sections using both experimental measurements and simulation test cases.

Figure 1:
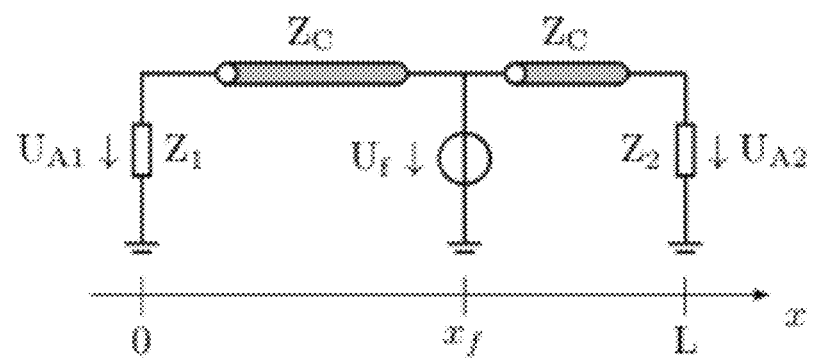

In order to provide a more straightforward use of the EMTR technique, we will make reference to a single-conductor overhead lossless transmission line (see FIG. 1) of length L. The line parameters may refer to a typical overhead transmission line. In particular, the surge impedance (characteristic impedance) is in the order of a few hundred Ohms.

We assume that at both line extremities power transformers are connected. Therefore, as discussed in the section addressing the main characteristics of electromagnetic transients, they are represented by means of high input impedances (Z1 and Z2 in FIG. 1). The fault coordinate is $x_f$ and fault transient waveforms are assumed to be recorded either at one end or at the two ends of the line. As the line model is lossless, the damping of the transients is provided only by the fault impedance, if any, and the high terminal impedances Z1 and Z2.

Finally, as the analyzed fault transients last for only a few milliseconds, we assume that the pre-fault condition of the line is characterized by a constant value of voltage all along the line length (0≤x≤L).

Frequency-Domain Expressions of Electromagnetic Transients Generated by the Fault The aim of this sub-section is to analytically describe the behavior of the line response after a fault. In order to express analytically the line response, the problem is formulated in the frequency domain. To specify the boundary conditions of the two line sections of FIG. 1, namely for $0 \leq x \leq x_f$ and $x_f \leq x \leq L$, we can define reflection coefficients at x=0 (i=1 of FIG. 1) and x=L (i=2 of FIG. 1) as $$\rho_i = \frac{Z_i - Z_c}{Z_i + Z_c}; \tag{6}$$

$$i = 1, 2.$$

Without losing generality, coefficients ρi in (6) could be assumed as frequency-independent within the considered short observation time.

Concerning the boundary condition at the fault location, we assume to represent it by means of a voltage source $U_f(\omega)$ located at $x=x_f$.

For the sake of abstraction, we represent the fault by means of an ideal voltage source with zero internal impedance that, as a consequence, represents a solid fault. Therefore, the voltage reflection coefficient in this point of the line is $\rho_f = -1$. Additionally, in view of the lossless line assumption, the line propagation constant, $\gamma$, is purely imaginary, namely: $\gamma = j\beta$, with $\beta = \omega/c$. The analytical expressions of voltages observed at the line terminals x=0 and x=L in the frequency domain read $$U_{A1}(\omega) = U(0, \omega) \quad (7)$$
$$= \frac{(1+\rho_1)e^{-\gamma x_f}}{1+\rho_1 e^{-2\gamma x_f}} U_f(\omega)$$

$$U_{A2}(\omega) = U(L, \omega) \quad (8)$$
$$= \frac{(1+\rho_2)e^{-\gamma(L-x_f)}}{1+\rho_2 e^{-2\gamma(L-x_f)}} U_f(\omega)$$

Note that the effect of the ground losses can be represented as an additional frequency-dependent longitudinal impedance [28]. However, except for the case of distributed exciting sources (such as those produced by a nearby lightning discharge), ground losses can be disregarded for typical overhead power lines [29].

In the two following sub-sections, we will derive EMTR-based analytical expressions that allow us to infer the location of the fault, for both cases of multiple and single observation points.

Frequency-Domain Application of EMTR by Using Two Observation Points at Each Line Terminal In principle, a number of observation points at which transient signals initiated by the fault are measured could be used to apply the EMTR technique. In the first step, it is assumed that two observation points at both ends of the line are used.

Figure 2:
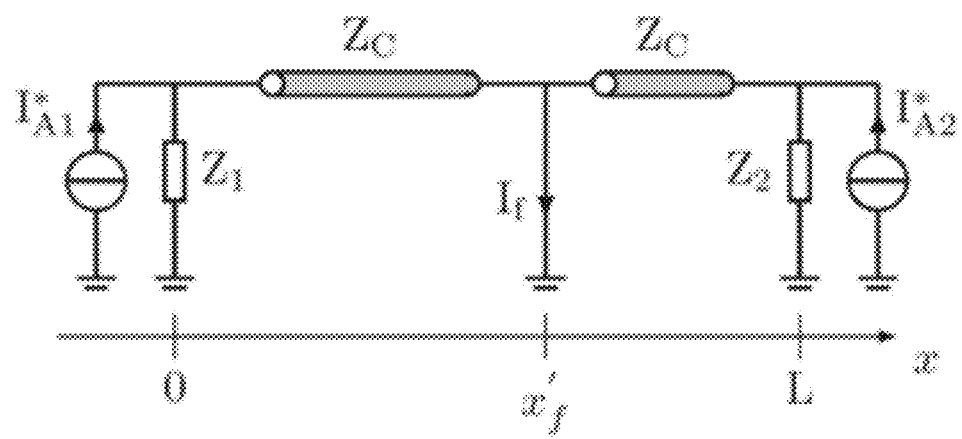

Equations (7) and (8) provide the frequency-domain expressions of fault-originated voltages at two observation points located at the line terminals. In agreement with the EMTR, we can replace these observation points with two sources each one imposing the time-reversed voltage fault transient, namely $U^*_{A1}(\omega)$ and $U^*_{A2}(\omega)$ where * denotes the complex conjugate. Since the reflection coefficients $\rho_1$ and $\rho_2$ are almost equal to 1, it is preferable to use the Norton equivalents as:

$$I^*_{A1} = \frac{U^*_{A1}(\omega)}{Z_1} \quad (9)$$

$$I^*_{A2} = \frac{U^*_{A1}(\omega)}{Z_2} \quad (10)$$

$$I^*_{A1}(\omega)$$
$$I^*_{A2}(\omega)$$

where and are the injected currents as shown on FIG. 2.

As the location of the fault is the unknown of the problem, we will place it at a generic distance $x'_f$. The contributions in terms of currents at the unknown fault location $x'_f$ coming from the first and the second time-reversed sources $I^*_{A1}(\omega)$ and $I^*_{A2}(\omega)$, are given respectively by $$I_{f1}(x'_f, \omega) = \frac{(1+\rho_1)e^{-\gamma x'_f}}{1+\rho_1 e^{-2\gamma x'_f}} I^*_{A1}(\omega) \quad (11)$$

-continued
$$I_{f2}(x'_f, \omega) = \frac{(1+\rho_2)e^{-\gamma(L-x'_f)}}{1+\rho_2 e^{-2\gamma(L-x'_f)}} I^*_{A2}(\omega) \quad (12)$$

Introducing (7)-(10) into (11) and (12), we obtain $$I_{f1}(x'_f, \omega) = \frac{(1+\rho_1)^2 e^{-\gamma(x'_f - x_f)}}{Z_1 (1+\rho_1 e^{-2\gamma x'_f})(1+\rho_1 e^{+2\gamma x_f})} U^*_f(\omega) \quad (13)$$

$$I_{f2}(x'_f, \omega) = \frac{(1+\rho_2)^2 e^{-\gamma(x'_f - x_f)}}{Z_2 (1+\rho_2 e^{-2\gamma(L-x'_f)})(1+\rho_2 e^{+2\gamma(L-x_f)})} U^*_f(\omega) \quad (14)$$

Therefore, we can derive a closed-form expression of the total current flowing through the guessed fault location $x'_f$ $$I_f(x'_f, \omega) = I_{f1}(x'_f, \omega) + I_{f2}(x'_f, \omega) \quad (15)$$

In what follows, we will make use of (15) to show the capability of the EMTR to converge the time-reversed injected energy to the fault location.

Figure 3:
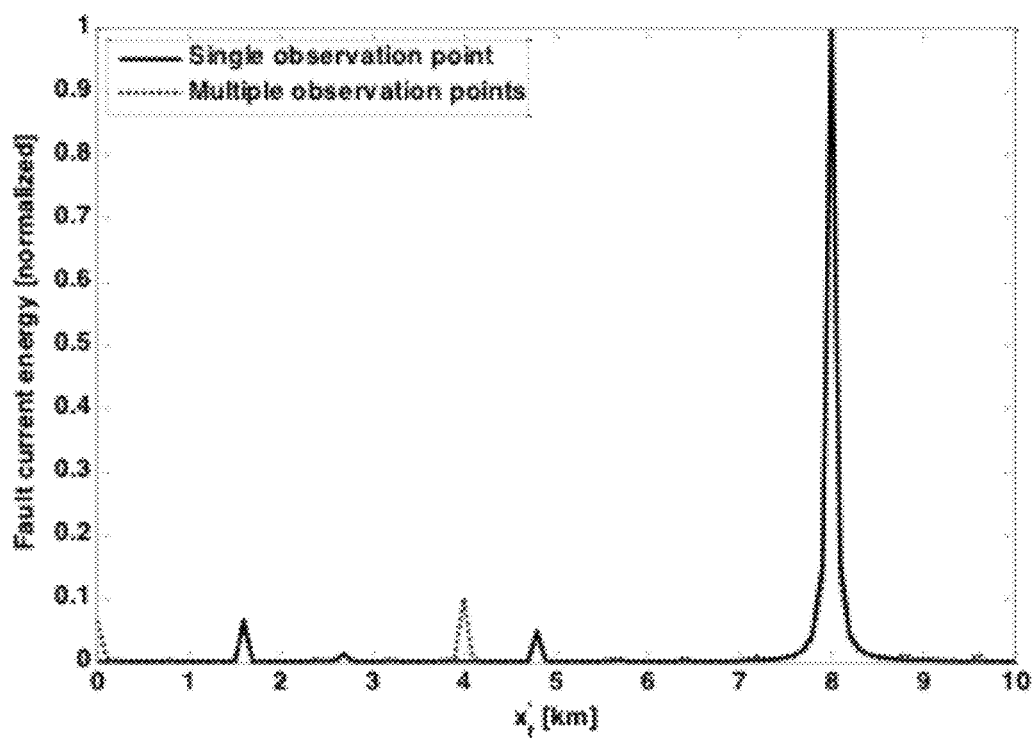

Let us make reference to a line characterized by a total length L=10 km and let us assume a fault occurring at $x_f$=8 km. The line is characterized by terminal impedances $Z_1 = Z_2 = 100$ k$\Omega$ and, for the fault, we assume $U_f = 1/j\omega$ V/(rad/s). By varying $x'_f$ from 0 to L, it is possible to compute the current at the guessed fault locations using (15). The dotted line in FIG. 3 shows the normalized energy of $I_f$ (where the normalization has been implemented with respect to the maximum signal energy value of $I_f$ for all the guessed fault locations) within a frequency-spectrum ranging from DC to 1 MHz. From FIG. 3, it is clear that the energy of $I_f(x'_f, \omega)$ reaches its maximum when the guessed fault location coincides with the real one.

Frequency-Domain Application of the EMTR by Using One Observation Point at One of the Line Terminals One of the main problems in power systems protection, in general, is the limited number of observation points where measurement equipment can be placed. Additionally, fault location methods require, in principle, time-synchronization between the measurements (in other words the measurement systems located at both ends of the lines should be capable of time-stamping the transients by using UTC—Universal Time Coordinate).

Therefore, the demonstration that the EMTR-based fault location method could be applied also for the case of a single observation point, is of importance.

Figure 4:
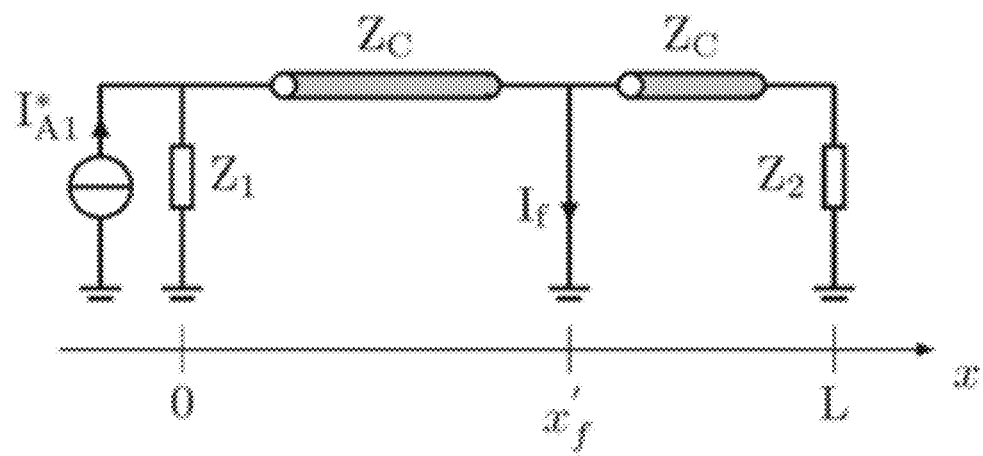

To this end, let us assume to observe the fault-originated electromagnetic transients only at one location, namely at the line left terminal. The network schematic in the time reversal state will be the one in FIG. 4.

By making reference to the configuration of the previous case, we can extend the procedure to the case where only one injecting current source ($I_{A1}$) is considered. In particular, we can derive from (9) the fault current at the guessed fault location $x'_f$ as follows:

$$I_f(x'_f, \omega) = I_{f1}(x'_f, \omega) \quad (16)$$

FIG. 3 shows the normalized energy of $I_f$ concerning both cases of one and two observation points within a frequency spectrum ranging from DC to 1 MHz.

It can be noted that the energy of $I_f(x'_f, \omega)$ is maximum when the guessed fault location is equal to the real one even for the case of a single observation point. From FIG. 3, it can be further observed that fault current energy curves feature additional small peaks in correspondence of incorrect fault location, although the correct one can still be properly identified. Additionally, the two curves (corresponding respectively to one and to two observation points) provide the correct fault location with negligible location differences.

Time-Domain EMTR-Based Fault Location Algorithm

In the previous sub-section, we have inferred closed form expressions of the fault current as a function of the guessed fault location. The purpose of this subsection is to extend the proposed method to realistic time-domain cases.

Figure 5:
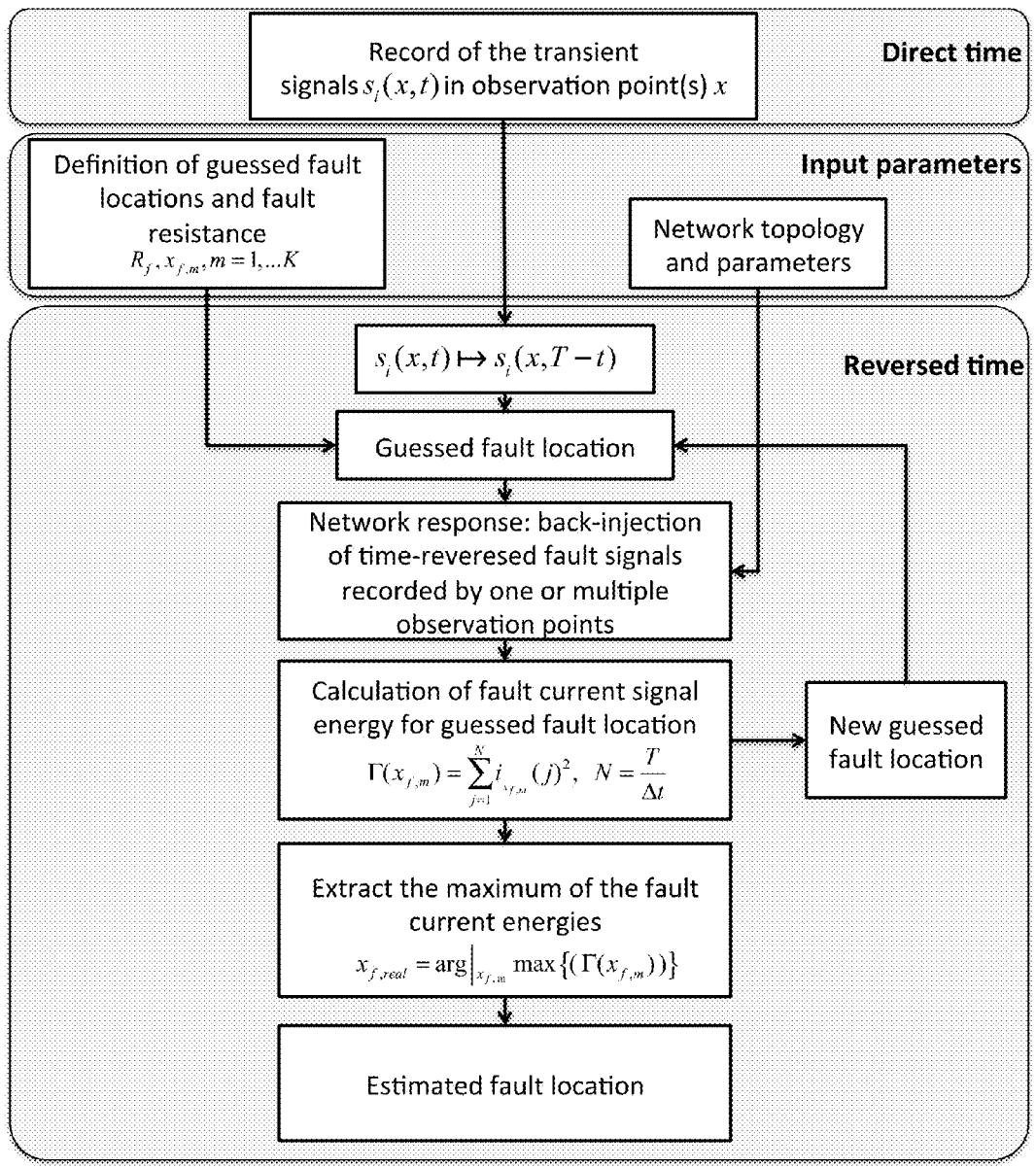

The flow-chart shown in FIG. 5, illustrates the step-by-step fault location procedure proposed in this study. As it can be seen, the proposed procedure, similarly to other methods proposed in the literature (e.g., [8], [9]), requires the knowledge of the network topology as well as its parameters. Such knowledge is used to build a corresponding network model where the lines are represented, for instance, by using constant-parameters line models [30]. Then, we assume to record fault transients, $s_i(t)$ (with i=1,2,3 for a three-phase system) at a generic observation point located inside the part of the network with the same voltage level comprised between transformers.

The transient signal initiated by the fault is assumed to be recorded within a specific time window, namely:

$$s_i(t), t \in [t_f, t_f + T] \quad (17)$$

where $t_f$ is the fault triggering time, and T is the recording time window large enough to damp-out $s_i(t)$.

The unknowns of the problem are the fault type, location and impedance. Concerning the fault type, we assume that the fault location procedure will operate after the relay maneuver. Therefore, the single or multi-phase nature of the fault is assumed to be known. Concerning the fault location, we assume a set of a-priori locations $x_{f,m}$, m=1, . . . , K for which the EMTR procedure is applied.

Concerning the fault impedance, for all the guessed fault locations, an a-priori value of the fault resistance, $R_{x_f}$, is assumed. As it will be shown in the section containing the application examples (section illustrating the application of the proposed method to two cases), different guessed values of $R_{x_f}$ do not affect the fault location accuracy.

Therefore, the recorded signal is reversed in time (equation (1)) and back-injected from one or multiple observation points into the system for each $x_{f,m}$. As discussed in the section herein above addressing the basic aspects of the EMTR theory, in order to make the argument of the time-reversed variables be positive for the duration of the signal, we add, in addition to time reversal, a time delay equal to the duration of the recording time T:

$$\hat{t} = (T + t_f) - t \quad (18)$$

$$\bar{s}(\hat{t}), \hat{t} \in [0, T]. \quad (19)$$

As shown in FIG. 5, for each of the guessed fault location, we can compute the energy of the signal that corresponds to the currents flowing through the guessed fault location as:

$$\Gamma(x_{f,m}) = \sum_{j=1}^{N} i_{f,m}(j)^2, \quad (20)$$

$$T = N\Delta t$$

where N is the number of samples and $\Delta t$ the sampling time. According to the EMTR method presented in the previous sub-section, the energy given by (20) is maximized at the real fault location. Thus, the maximum of the calculated signal energies will indicate the real fault point:

$$x_{f,real} = \arg|_{x_{f,m}} \max\{(\Gamma(x_{f,m}))\}. \quad (21)$$

Experimental Validation

In this section, the experimental validation of the proposed method is presented by making reference to a reduced-scale coaxial cable system. Such a system has been realized by using standard RG-58 and RG-59 coaxial cables where real faults were hardware-emulated.

Figure 6:
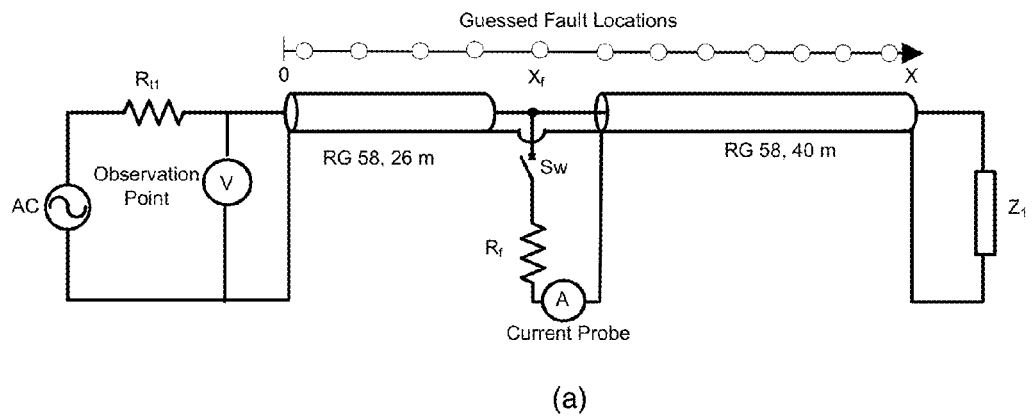
Figure 6:
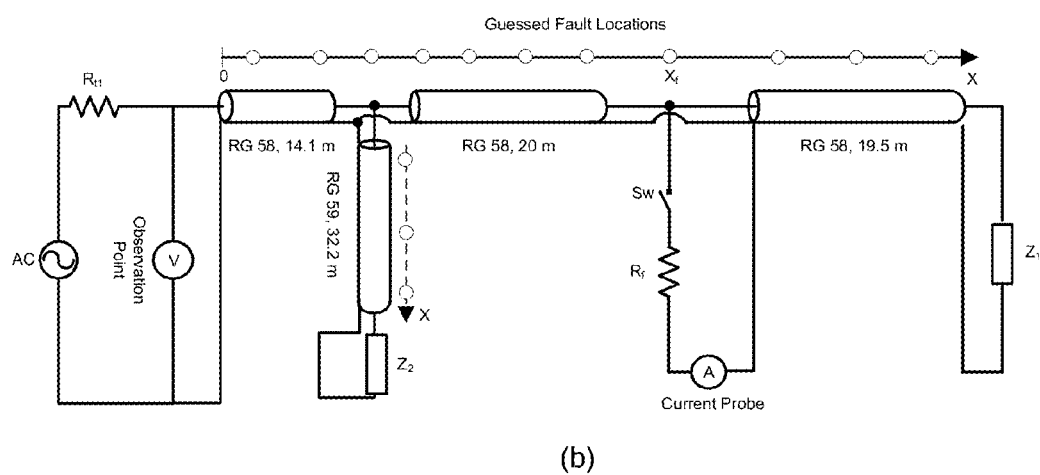

The topologies adopted to carry out the experimental validation are shown in FIG. 6. As seen on the figure, the first topology corresponds to a single transmission line whilst the second one corresponds to a T-shape network where the various branches are composed of both RG-58 and RG-59 cables (i.e., each branch has a different surge impedance but the same propagation speed). FIG. 6 shows also the guessed fault locations at which the current flowing through the fault was measured. For each considered topology, transients generated by the fault are recorded at one observation point, shown also on FIG. 6. The fault-originated transients were measured by means of a 12-bit oscilloscope (LeCroy Waverunner HRO 64Z) operating at a sampling frequency of 1 GSa/s (Giga Samples per second). For the direct time, the oscilloscope directly records voltages at the shown observation points marked in FIGS. 6(a) and 6(b). For the reversed-time, the current at each guessed fault location was measured by using a 2877 Pearson current probe characterized by a transfer impedance of 1Ω and an overall bandwidth of 300 Hz-200 MHz (It is worth observing that the switching frequencies for the adopted reduced-scale systems are in the order of few MHz.). The time-reversed transient waveforms were generated by using a 16-bit arbitrary waveform generator (LeCroy ArbStudio 1104) operating at a sampling frequency of 1 GSa/s (the same adopted to record the fault-originated waveforms). The lines were terminated by high impedances (Z1 and Z2 equal to 1 MΩ) and the voltage source injecting the time-reversed signal was connected to the line through a lumped resistance of R=4.7 kΩ in order to emulate, in a first approximation, the high-input impedance of power transformers with respect to fault transients.

Figure 7:
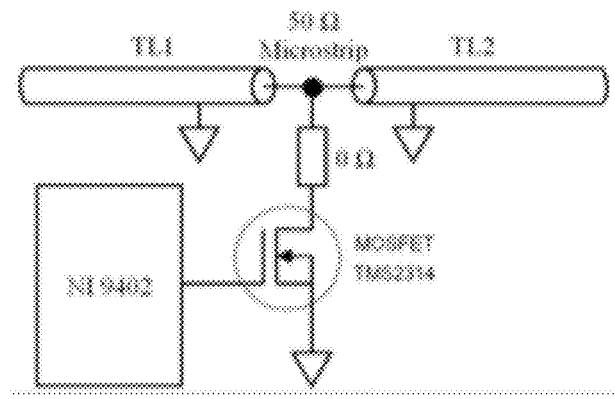

The faults were generated at an arbitrary point of the cable network. They were realized by a short circuit between the coaxial cable shield and the inner conductors. It is important to underline that such type of faults excites the shield-to-inner conductor propagation mode that is characterized, for the adopted coaxial cables, by a propagation speed of of 65.9% of the speed of light c. It is worth noting that the limited lengths of the reduced-scale cables (i.e. tens of meters) involve propagation times in the order of tens to hundreds of nanoseconds. Such a peculiarity requires that the fault emulator needs to be able to change its status in a few nanoseconds in order to correctly emulate the fault. The chosen switch was a high speed MOSFET (TMS2314) with a turn-on time of 3 ns. The MOSFET was driven by a National Instruments digital I/O card C/series 9402 able to provide a gate signal to the MOSFET with a sub-nanosecond rise time and a maximum voltage of 3.4 V. The schematic representation of the circuit of the hardware fault emulator is illustrated in FIG. 7. Note that the experiment reproduces solid faults since no resistors were placed between the MOSFET drain and the transmission line conductors.

Figure 8:
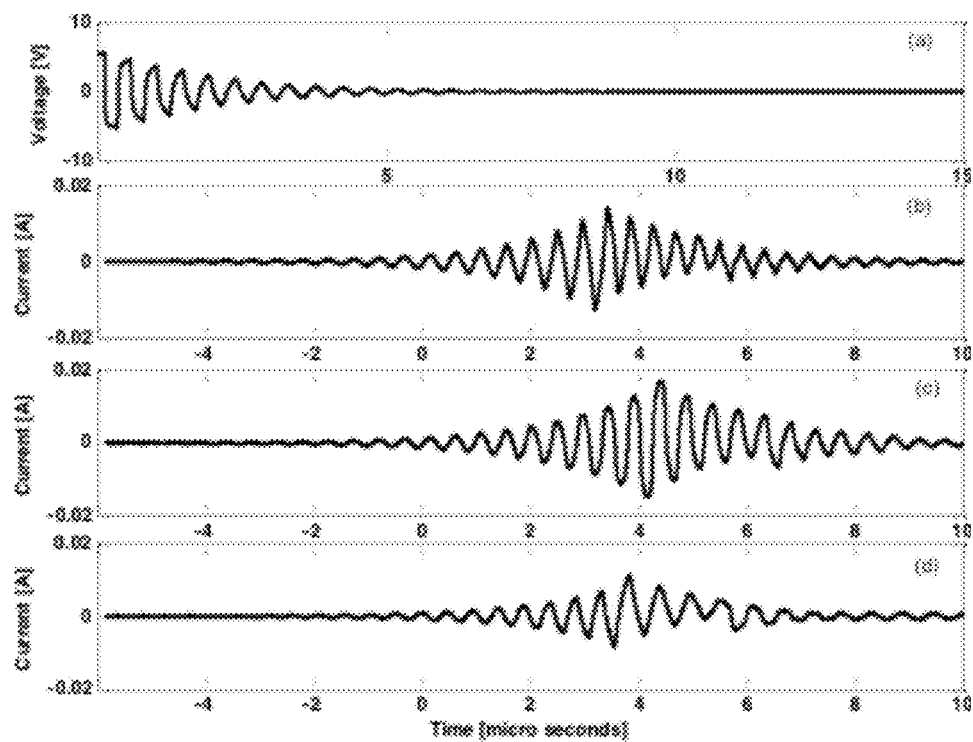
FIG. 8 shows experimentally measured waveforms for a fault location $x_f=26$ m for the topology of FIG. 6a; (a) direct-time voltage measured at the observation point located at the beginning of the line. Measured fault currents as a result of the injection of time-reversed signal at guessed fault locations (b) $x'_f=23$ m, (c) $x'_f=26$ m (real fault location) and (d) $x'_f=28$ m.

By making reference to the topology of FIG. 6(a), FIG. 8(a) shows the measured direct-time voltage at the considered observation point for a fault location $x_f$=26 m. The measured voltage was then time-reversed and injected back into the line using the arbitrary waveform generator for each of the 12 different guessed fault locations, that are indicated in FIG. 6(a). For each case, the fault current resulting from the injection of the time-reversed signal of FIG. 8(a) was measured using the Pearson current probe. FIGS. 8(b)-8(d) show the waveforms of the fault current at the guessed fault locations x'$_f$=23 m, x'$_f$=26 m and x'$_f$=28 m respectively, resulting from the injection of the time-reversed signal.

Figure 9:
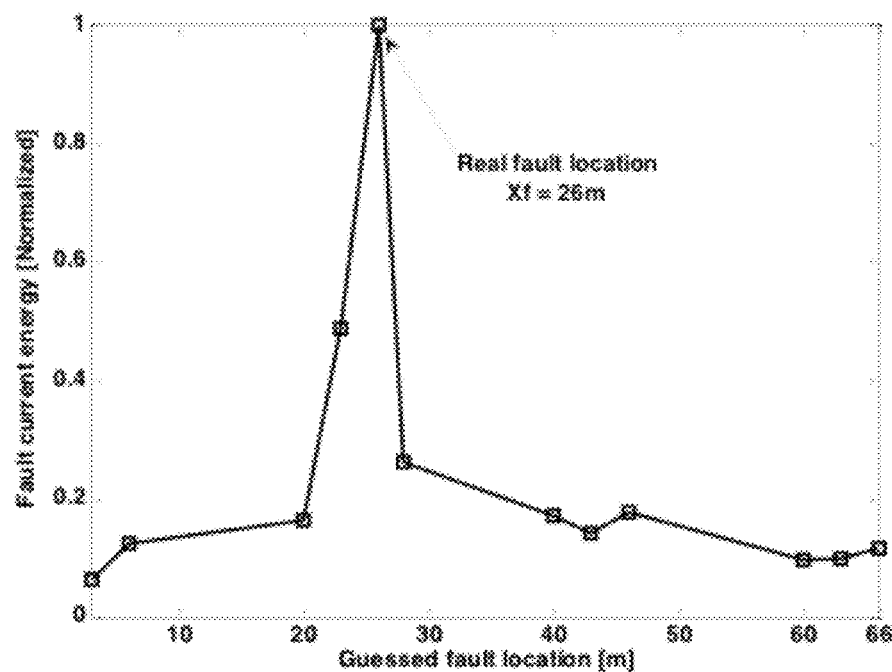
FIG. 9 shows normalized energy of the measured fault current as a function of the position of the guessed fault location. The real fault location is at $x_f=26$ m.

The normalized energy of the measured fault current signals is shown in FIG. 9 as function of the guessed fault location (also in this case, the normalization has been implemented with respect to the maximum signal energy of the fault current in the guessed fault location). As it can be observed, the correct fault location is uniquely and clearly identified.

Figure 10:
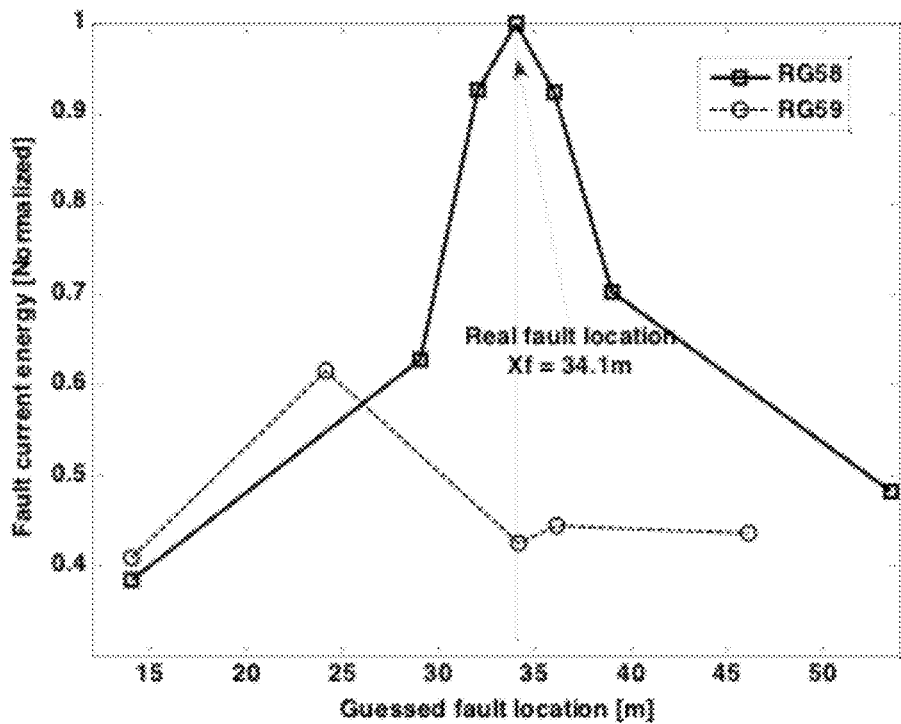
FIG. 10 shows normalized energy of the measured fault current as a function of the position of the guessed fault location for the case of the topology presented in FIG. 6b. The real fault location is at $x_f=34.1$m in RG-58.

FIG. 10 shows the same signal energy profiles for the case of the topology of FIG. 6(b). In this case, the real fault location is at a distance of 34.1 m from the source and in the RG-58 section of the network. As it can be observed, also in the case of a multi-branched network with lines characterized by different electrical parameters (i.e. inhomogeneous lines with different surge impedances), the proposed methodology correctly identifies the fault location.

APPLICATION EXAMPLES

Inhomogeneous Network Composed of Mixed Overhead-Coaxial Cable Lines.

In this section, we present a first numerical validation of the proposed technique. For this purpose, reference is made to the case of a network composed of a three-conductor transmission line and an underground coaxial cable (see FIG. 11).

The overhead line length is 9 km and the cable length is 2 km. They are modeled by means of a constant-parameter model implemented within the EMTP-RV simulation environment [30]-[32]. Both the overhead line and the cable parameters have been inferred from typical geometries of 230 kV lines and cables. The series impedance and shunt admittance matrices for the line and cable are given by (22)-(25) and have been calculated in correspondence of the line and cable switching frequency.

$$Z_{Line} = \begin{bmatrix} 1.10 + j15.32 & 1.00 + j5.80 & 1.00 + j4.64 \\ 1.00 + j5.80 & 1.09 + j15.33 & 1.00 + j5.80 \\ 1.00 + j4.64 & 1.00 + j5.80 & 1.00 + j15.32 \end{bmatrix} \frac{\Omega}{km} \quad (22)$$

$$Y_{line} = \begin{bmatrix} 2 \cdot 10^{-4} + j67.53 & -j16.04 & -j7.91 \\ -j16.04 & 2 \cdot 10^{-4} + j70.12 & -j16.04 \\ -j7.91 & -j16.04 & 2 \cdot 10^{-4} + j67.53 \end{bmatrix} \times 10^{-6} \frac{S}{km} \quad (23)$$

$$Z_{cable} = \begin{bmatrix} 0.07 + j0.70 & 0.05 + j0.45 & 0.05 + j0.41 & 0.05 + j0.62 & 0.05 + j0.45 & 0.05 + j0.41 \\ 0.05 + j0.45 & 0.07 + j0.70 & 0.05 + j0.45 & 0.05 + j0.45 & 0.05 + j0.62 & 0.05 + j0.45 \\ 0.05 + j0.41 & 0.05 + j0.45 & 0.07 + j0.70 & 0.05 + j0.41 & 0.05 + j0.45 & 0.05 + j0.62 \\ 0.05 + j0.62 & 0.05 + j0.45 & 0.05 + j0.41 & 0.03 + j0.62 & 0.05 + j0.45 & 0.05 + j0.41 \\ 0.05 + j0.45 & 0.05 + j0.62 & 0.05 + j0.45 & 0.05 + j0.45 & 0.03 + j0.62 & 0.05 + j0.45 \\ 0.05 + j0.41 & 0.05 + j0.45 & 0.05 + j0.62 & 0.05 + j0.41 & 0.05 + j0.45 & 0.03 + j0.62 \end{bmatrix} \frac{\Omega}{km} \quad (24)$$

$$Y_{cable} = \begin{bmatrix} 0.12 + j41.46 & 0 & 0 & -0.12 - j41.46 & 0 & 0 \\ 0 & 0.12 + j41.46 & 0 & 0 & -0.12 - j41.46 & 0 \\ 0 & 0 & 0.12 + j41.46 & 0 & 0 & -0.12 - j41.46 \\ -0.12 - j41.46 & 0 & 0 & 2.35 + j94.61 & 0 & 0 \\ 0 & -0.12 - j41.46 & 0 & 0 & 2.35 + j94.61 & 0 \\ 0 & 0 & -0.12 - j41.46 & 0 & 0 & 2.35 + j94.61 \end{bmatrix} \times 10^{-6} \frac{S}{km} \quad (25)$$

As it can be observed, the simulated lines take into account the losses, even though as discussed in the section herein above addressing the main, characteristics of electromagnetic transients originated by faults in power systems, the EMTR is, in principle, applicable in a lossless propagation medium. However, as already seen in the experimental validation where real cables with losses have been used, the proposed method was still able to effectively locate the fault.

Concerning the line start and cable end, they are assumed to be terminated with power transformers represented, as discussed in the previous sections, by high impedances, assumed, in a first approximation, equal to 100 kΩ. The supply of the line is provided by a three-phase AC voltage source placed at x=0. A schematic representation of the system is shown in FIG. 11. All the fault transients were observed at the overhead line start in three observation points (OP1, OP2, OP3) corresponding to the three conductors of the line (left terminal).

Two fault cases are considered to examine the performance of the proposed method for the case of inhomogeneous networks (i) a three-conductor-to-ground fault at 7 km away from the source with a 0Ω fault impedance (solid) and, (ii) a three-conductor-to-ground fault at 5 km away from the source with a 100Ω fault impedance (high-impedance fault). In agreement with the proposed procedure, the position of the guessed fault location was moved along the overhead and cable lines assuming, for the fault impedance, a-priori fixed values of 0, 10, and, 100Ω. It is worth noting that in order to find the fault location, it is assumed that the fault type is known from other protective equipment.

FIG. 12 and FIG. 13 show the energy of the current flowing through the guessed fault location for solid and high impedance faults, respectively. These figures illustrate the calculated normalized fault current energies for three a-priori guessed values of the fault resistance, namely 0, 10 and 100Ω, as a result of the injection of the time-reversed voltage at the observation points (overhead line left terminal). In order to evaluate the accuracy of the proposed method, the position of the guessed fault location was varied with a step of 200 m near to the real fault location.

As it can be seen, the proposed method is effective in identifying the fault location in inhomogeneous networks even when losses are present. The proposed method shows very good performances for high-impedance faults and, also, appears robust against the a-priori assumed fault impedance. The accuracy of the method appears to be less than 200 m (assumed value for the separation between guessed fault locations).

Radial Distribution Network: IEEE 34-Bus Test Distribution Feeder

In order to test the performance of the proposed fault location method in multi-branch and multi-terminal networks, the IEEE 34-bus test feeder is considered. The model of this network is the same adopted in [13] where, for the sake of simplicity, the following assumptions have been done:
1. all transmission lines are considered to be characterized by configuration "ID #500" as reported in [33];
2. the loads are considered to be connected via interconnection transformers and are located at lines terminations.

FIG. 14 shows the IEEE 34-bus test distribution network implemented in the EMTP-RV simulation environment. According to the blocking behavior of the transformers for traveling waves, such a configuration could be divided into three zones where these zones are characterized by the buses between two transformers. For this case study, only the first zone is considered as it shown in FIG. 14. The observation point for this network is located at the secondary winding of the transformer and is shown in FIG. 14.

Four different case studies are considered to examine the performance of the proposed method: (i) a three-conductor-to-ground fault at Bus 808 with a 0Ω fault impedance, (ii) a three-conductor-to-ground fault at Bus 812 with a 100Ω fault impedance, (iii) a single-conductor-to-ground fault at Bus 810 with a 0Ω fault impedance, and (iv) a single-conductor-to-ground fault at Bus 806 with a 100Ω fault impedance.

The recorded transient signals are time-reversed and, for each guessed fault location, the current flowing through the fault resistance is calculated by simulating the network with back-injected time-reversed signals form the observation points. As for the previous cases, the normalized energy of this current is calculated for all guessed fault locations with different guessed fault impedances (i.e., 0, 10, 100Ω). FIG. 15 shows the calculated fault current energy for (a) a three-conductor-to-ground solid (0Ω) fault at Bus 808, and (b) a three-conductor-to-ground high-impedance fault (100Ω) at Bus 812.

From FIGS. 15 and 16 it is possible to infer the remarkable performances of the proposed fault location method for the case of realistic multi-branch multi-terminal lines. Additionally, the proposed method appears, also in this case, to be robust against solid and high-impedance faults as well as against different fault types (phase-to-ground or three-phase ones).

CONCLUSION

We presented in the present specification a new method to locate faults in power networks based on the use of the ElectroMagnetic Time Reversal (EMTR) technique. The application of the EMTR to locate faults in a power network is carried out in three steps:
(1) measurement of the fault-originated electromagnetic transient in a single observation point;
(2) simulation of the back-injection of the time-reversed measured fault signal for different guessed fault locations and using the network model; and
(3) determination of the fault location by computing, in the network model, the point characterized by the largest energy concentration associated with the back-injected time-reversed fault transients.

Compared to other transient-based fault location techniques, the proposed method is straight-forwardly applicable to inhomogeneous media that, in our case, are represented by mixed overhead and coaxial power cable lines. A further advantage of the developed EMTR-based fault location method is that it minimizes the number of observation points. In particular, we have shown that a single observation point located in correspondence of the secondary winding of a substation transformer is enough to correctly identify the fault location.

Another important advantage of the proposed method is that its performances are not influenced by the topology of the system, the fault type and its impedance. The above-mentioned peculiar properties have been verified by applying the proposed method to different networks, namely:
(i) a non-homogeneous network composed of overhead-coaxial cable transmission lines, and
(ii) the IEEE distribution test networks characterized by multiple terminations.

The proposed method has been also validated by means of reduced scale experiments considering two topologies, namely one single transmission line and a T-shape network. In both cases, the proposed EMTR-based approach was able to correctly identify the location of the fault.

The resulting fault location accuracy and robustness against uncertainties have been tested and, in this respect, the proposed method appears to be very promising for real applications.

REFERENCES

[1] IEEE Std C37.114, "IEEE guide for determining fault location on AC transmission and distribution lines", 2004.
[2] H. M. Manesh, G. Lugrin, R. Razzaghi, C. Romero, M. Paolone, F. Rachidi, "A New Method to Locate Faults in Power Networks Based on Electromagnetic Time Reversal", Proc. of 13th IEEE International Workshop on Signal Processing Advances in Wireless Communications, SPAWC, June 2012
[3] M. S. Sachdev and R. Agarwal, "A technique for estimating transmission line fault locations from digital impedance relay measurements" IEEE Trans. Power Del., vol. 3, no. 1, pp. 121-129, January 1988.
[4] K. Srinivasan and A. St.-Jacques, "A new fault location algorithm for radial transmission lines with loads," IEEE Trans. Power Del., vol. 4, no. 3, pp. 1676-1682, July 1989.
[5] A. A. Girgis, D. G. Hart, and W. L. Peterson, "A new fault location technique for two- and three-terminal lines," IEEE Trans. Power Del., vol. 7, no. 1, pp. 98-107, January 1992.
[6] G. B. Ancell and N. C. Pahalawatha, "Maximum likelihood estimation of fault location on transmission lines using travelling waves," IEEE Trans. Power Del., vol. 9, no. 2, pp. 680-689, April 1994.
[7] O. Chaari, M. Meunier, and F. Brouaye, "Wavelets: A new tool for resonant grounded power distribution systems relaying," IEEE Trans. Power Del., vol. 11, no. 3, pp. 1301-1308, July 1996.

[8] F. H. Magnago and A. Abur, "Fault location using wavelets," IEEE Trans. Power Del., vol. 13, no. 4, pp. 1475-1480, October 1998.

[9] F. H. Magnago and A. Abur, "A new fault location technique for radial distribution systems based on high frequency signals," in Proc. IEEE-Power Eng. Soc. Summer Meeting, vol. 1, pp. 426-431, Jul. 18-22, 1999.

[10] D. W. P. Thomas, R. E. Batty, C. Christopoulos, and A. Wang, "A novel transmission-line voltage measuring method," IEEE Trans. Instrum. Meas., vol. 47, no. 5, pp. 1265-1270, October 1998.

[11] F. Yan, Zh. Chen, Zh. Liang, Y. Kong, P. Li, "Fault location using wavelet packets", Proc. of Int. Conf. on Power System Technology, PowerCon 2002, Vol. 4, pp. 2575-2579, 13-17 October 2002.

[12] A. Borghetti, S. Corsi, C. A. Nucci, M. Paolone, L. Peretto, and R. Tinarelli, "On the use of continuous-wavelet transform for fault location in distribution power networks," Elect. Power Energy Syst., vol. 28, pp. 608-617, 2006.

[13] A. Borghetti, M. Bosetti, M. Di Silvestro, C.A. Nucci and M. Paolone, "Continuous-Wavelet Transform for Fault Location in Distribution Power Networks: Definition of Mother Wavelets Inferred from Fault Originated Transients", IEEE Trans. Power Del., vol. 23, No. 2, pp.380-388, May 2008.

[14] A. Borghetti, M. Bosetti, C.A. Nucci, M. Paolone, A. Abur, "Integrated Use of Time-Frequency Wavelet Decompositions for Fault Location in Distribution Networks: Theory and Experimental Validation IEEE Trans. Power Del., vol. 25, issue 4, Oct. 2010, pp. 3139-3146.

[15] M. Fink, C. Prada, F. Wu and D. Cassereau, "Self focusing in inhomogeneous media with time reversal acoustic mirrors ", IEEE Ultrason. Symp., pp. 681-686, 1989.

[16] M. Fink, "Time reversal of ultrasonic fields-Part I: Basic principles", IEEE Trans. on Ultrasonics, Ferroelectrics and Frequency Control, vol. 39, issue 5, Sep. 1992, pp. 555-566.

[17] F. Wu, J.-L. Thomas, M. Fink, "Time reversal of ultrasonic fields-Part II: Experimental results", IEEE Trans. on Ultrasonics, Ferroelectrics and Frequency Control, vol. 39, issue 5, Sep. 1992, pp: 567-578.

[18] D. Cassereau, M. Fink, "Time-reversal of ultrasonic fields-Part III. Theory of the closed time-reversal cavity", IEEE Trans. on Ultrasonics, Ferroelectrics and Frequency Control, vol. 39, issue 5, Sep. 1992, pp: 579-592.

[19] G. Lerosey, J. de Rosny, A. Tourin, A. Derode, G. Montaldo, M. Fink, Time Reversal of Electromagnetic Waves, Phys. Rev. Lett. 92, pp. 193904-193901-193903, 2004.

[20] D. Liu; G. Kang; L. Li; Y. Chen; S. Vasudevan, W. Joines, Q. Huo Liu, J. Krolik, L. Carin, "Electromagnetic time-reversal imaging of a target in a cluttered environment", IEEE Trans. Antennas Propagat., vol. 53, pp. 3058-3066, 2005.

[21] H. Zhai, S. Sha, V. K. Shenoy, S. Jung, M. Lu, K. Min, S. Lee, D.S. Ha, "An Electronic Circuit System for Time-Reversal of Ultra-Wideband Short Impulses Based on Frequency-Domain Approach", IEEE Trans. Microwave Theory and Techniques, vol. 58, issue: 1, pp. 74-86, 2010.

[22] N. Mora, F. Rachidi, M. Rubinstein, "Application of the Time Reversal of Electromagnetic Fields to Locate Lightning Discharges", Journal of Atmospheric Research, Vol. 117, pp. 78-85, 2012.

[23] L Abboud, A. Cozza and L. Pichon, "A Matched-Pulse Approach for Soft-Fault Detection in Complex Wire Networks", IEEE Trans. on Instrumentation and Measurements, vol. 61, issue: 6, pp: 1719-1732, June 2012.

[24] J.-G. Minonzio, "Decomposition de l'Opérateur de Retournement Temporel appliquée à l'imagerie et à la caractérisation ultrasonore", PhD dissertation, Université de Paris 7, 2006.

[25] G. Lugrin, N. Mora, F. Rachidi, M. Rubinstein, G. Diendorfer, "On the use of the time reversal of electromagnetic fields to locate lightning discharges", 31st International Conference on Lightning Protection (ICLP), Vienna, Austria, Sep. 3-7, 2012.

[26] A. Borghetti, M. Bosetti, C.A. Nucci, M. Paolone, A. Abur, "Fault location in active distribution networks by means of the continuous-wavelet analysis of fault-originated high frequency transients", Proc. of the Cigré General Session 2010, Aug. 22-27, 2010, Paris, France, paper C4-108.

[27] F. Rachidi, C.A. Nucci, M. Ianoz, C. Mazzetti, "Influence of a lossy ground on lightning-induced voltages on overhead lines", IEEE Trans. on Electromagnetic Compatibility, Vol. 38, No. 3, August 1996.

[28] F. Rachidi, "A Review of Field-to-Transmission Line Coupling Models with Special Emphasis to Lightning-Induced Voltages", IEEE Trans. on Electromagnetic Compatibility, Vol 54, No. 4, pp. 898 -911, 2012.

[29] H. W. Dommel: "Digital computer solution of Electromagnetic Transietns in single and multiphase networks", IEEE Transactions on Power Apparatus and Systems, Vol. PAS-88, No. 4, pages 388-399, April 1969.

[30] J. Mahseredjian, S. Lefebvre and X.-D. Do, "A new method for time-domain modelling of nonlinear circuits in large linear networks", Proc. of 11th Power Systems Computation Conference PSCC, August 1993.

[31] J. Mahseredjian, S. Dennetière, L. Dubé, B. Khodabakhchian and L. Gérin-Lajoie: "On a new approach for the simulation of transients in power systems". Electric Power Systems Research, Volume 77, Issue 11, September 2007, pp. 1514-1520.

[32] IEEE Distribution Planning Working Group, "Radial distribution test feeders," IEEE Trans. Power Syst., vol. 6, no. 3, pp. 975-985, August 1991.

The invention claimed is:

1. A method for determining a fault location in an electrical power network including multi-conductor lines, comprising the steps of:

measuring at an observation point located anywhere along one of the multi-conductor lines, for each of the conductors of the multi-conductor line, respectively, a fault-originated electromagnetic transient signal;

defining a set of guessed fault locations, each of the guessed fault locations has a different determined location in the electrical power network, and each of the guessed fault locations is attributed a same arbitrary fault impedance;

defining a network model for the electrical power network, based on a topology of the electrical power network and electrical parameters of the multi-conductor lines, the defined network model capable of simulating electromagnetic traveling waves of the electrical power network;

computing for each conductor a time inversion of the measured fault-originated electromagnetic transients signal;

back-injecting in each conductor of the defined network model, corresponding to the multi-conductor line, the corresponding computed time inversion from a virtual observation point in the network model corresponding to the observation point;

calculating in the network model the energy of a fault current signal for each of the guessed fault locations, and identifying the fault location as the guessed fault location providing the largest fault current signal energy.

2. The method of claim 1, wherein the measurement of the fault-originated electromagnetic transient signal is at least one of a current and a voltage measurement.

3. The method of claim 1, wherein the defined network model is a lossless line model.

4. The method of claim 1, wherein in the step of calculating the energy of the fault current signal, a normalized energy is calculated for different guessed fault impedances for each of the guessed fault locations.

* * * * *